United States Patent [19]

Dreibelbis et al.

[11] Patent Number: 5,019,772
[45] Date of Patent: May 28, 1991

[54] TEST SELECTION TECHNIQUES

[75] Inventors: Jeffrey H. Dreibelbis, Williston; John A. Gabric; Erik L. Hedberg, both of Essex Junction, all of Vt.

[73] Assignee: International Business Machines Corporation, Armonk, N.Y.

[21] Appl. No.: 355,589

[22] Filed: May 23, 1989

[51] Int. Cl.$^5$ ............................................. G01R 31/28
[52] U.S. Cl. .......................... 324/158 R; 324/158 T; 307/362; 371/22.1
[58] Field of Search ........................... 371/22.1–22.6; 324/158 R, 158 T; 307/362

[56] References Cited

U.S. PATENT DOCUMENTS

| | | | |
|---|---|---|---|
| 4,334,307 | 6/1982 | Bourgeois et al. | 371/16 |
| 4,336,495 | 6/1982 | Happe | 324/158 R |
| 4,398,146 | 8/1983 | Draheim et al. | 324/158 X |
| 4,583,179 | 4/1986 | Horii et al. | 364/483 |
| 4,612,499 | 9/1986 | Andresen et al. | 324/73 R |
| 4,691,161 | 9/1987 | Kano et al. | 371/22.5 |
| 4,697,140 | 9/1987 | Saito et al. | 324/73 R |
| 4,714,876 | 12/1987 | Gay et al. | 324/158 R |
| 4,812,680 | 3/1989 | Kawashima et al. | 307/362 |
| 4,833,395 | 5/1989 | Sasaki et al. | 324/158 T |
| 4,912,709 | 3/1990 | Teske et al. | 371/22.1 |
| 4,914,379 | 4/1990 | Maeno | 371/22.5 |

OTHER PUBLICATIONS

JEDEC Solid State Products Engineering Council, Committee Ballot, dated Oct. 17, 1986, Subject and Background page and pp. 1 to 5.

Primary Examiner—Kenneth A. Wieder
Assistant Examiner—William J. Burns
Attorney, Agent, or Firm—Stephen J. Limanek

[57] ABSTRACT

A test selection system is provided which includes a semiconductor substrate having a pin connected thereto and an integrated circuit disposed on the substrate and connected to the pin having an operating voltage within a given voltage range. A latch conditioning circuit having an input responsive to a voltage of a given magnitude has an output connected to a latch, and a voltage control circuit operable at a voltage without the given voltage range selectively applies a control voltage of the given magnitude to the input of the latch conditioning circuit. A voltage without the given voltage range is applied to the pin during a first interval of time to produce the control voltage for establishing a test mode and a voltage within the given voltage range is applied to the pin during a second interval of time to establish a normal operating mode for the integrated circuit.

25 Claims, 2 Drawing Sheets

TEST SELECTION TECHNIQUES

TECHNICAL FIELD

This invention relates to test selection techniques and, more particularly, to techniques for testing circuits formed on a semiconductor substrate or integrated circuit chip without providing an additional pin or pad on the substrate or chip for accessing test circuits formed on the substrate or chip.

BACKGROUND ART

Requirements exist during the testing of certain circuits, such as static random access memory circuits, and also dynamic random access memory circuits, to enable special test modes of the circuits not only during manufacturing but also by a customer at the module or package level. These tests may include, but are not limited to, voltage acceleration tests on parts with on-chip supply regulators, self-test initiation and fuse blown signatures. Use of special pins connected to these circuits for testing purposes is not feasible in many instances due to the lack of any extra pin locations or positions on industry standard packages.

In U.S. Pat. No. 4,612,499, filed Nov. 7, 1983, there is disclosed a test input circuit which uses specially designed complementary metal oxide semiconductor (CMOS) transistors controlled by a middle range voltage signal connected to an input pin used for data input in normal operation.

U.S. Pat. No. 4,334,307, filed Dec. 28, 1979, discloses a system using firmware for executing a self-test routine each time the system goes through a power-up cycle.

U.S. Pat. No. 4,697,140, filed Feb. 11, 1986, discloses a system wherein a switching circuit is responsive to a predetermined level of an input signal externally applied to a reset terminal for supplying a testing clock signal.

U.S. Pat. No. 4,583,179, filed Dec. 29, 1982, discloses a circuit wherein during an inspection period of an internal node to determine the condition of a fuse element a high voltage is supplied via an external input-/output pin.

DISCLOSURE OF THE INVENTION

It is an object of this invention to provide an improved test selection system for an integrated circuit, either logic or memory, formed on a semiconductor substrate or integrated circuit chip having an access through a pin located on the substrate or chip to which an element or circuit used for normal operation of the integrated circuit is connected.

In accordance with the teachings of this invention, a test selection system is provided which includes a semiconductor substrate or integrated circuit chip having a pin or pad connected thereto and an integrated circuit formed on the substrate or chip and connected to the pin or pad and having an operating voltage within a given voltage range. A latch conditioning circuit has an input responsive to a voltage of a given magnitude and an output connected to an input of a latch. Means operable at a voltage without the given voltage range for producing a control voltage of the given magnitude is connected to the input of the latch conditioning circuit. A test enabling terminal is coupled to the output of the latch and to the integrated circuit. A voltage without the given voltage range is applied to the pin or pad during a first interval of time to establish a test mode at the test enabling terminal and a voltage within the given voltage range is applied to the pin or pad during a second interval of time to establish a normal operating mode for the integrated circuit.

The foregoing and other object, features and advantages of the invention will be apparent from the following more particular description of the preferred embodiments of the invention, as illustrated in the accompanying drawings.

BEST MODE FOR CARRYING OUT THE INVENTION

Figure 1:
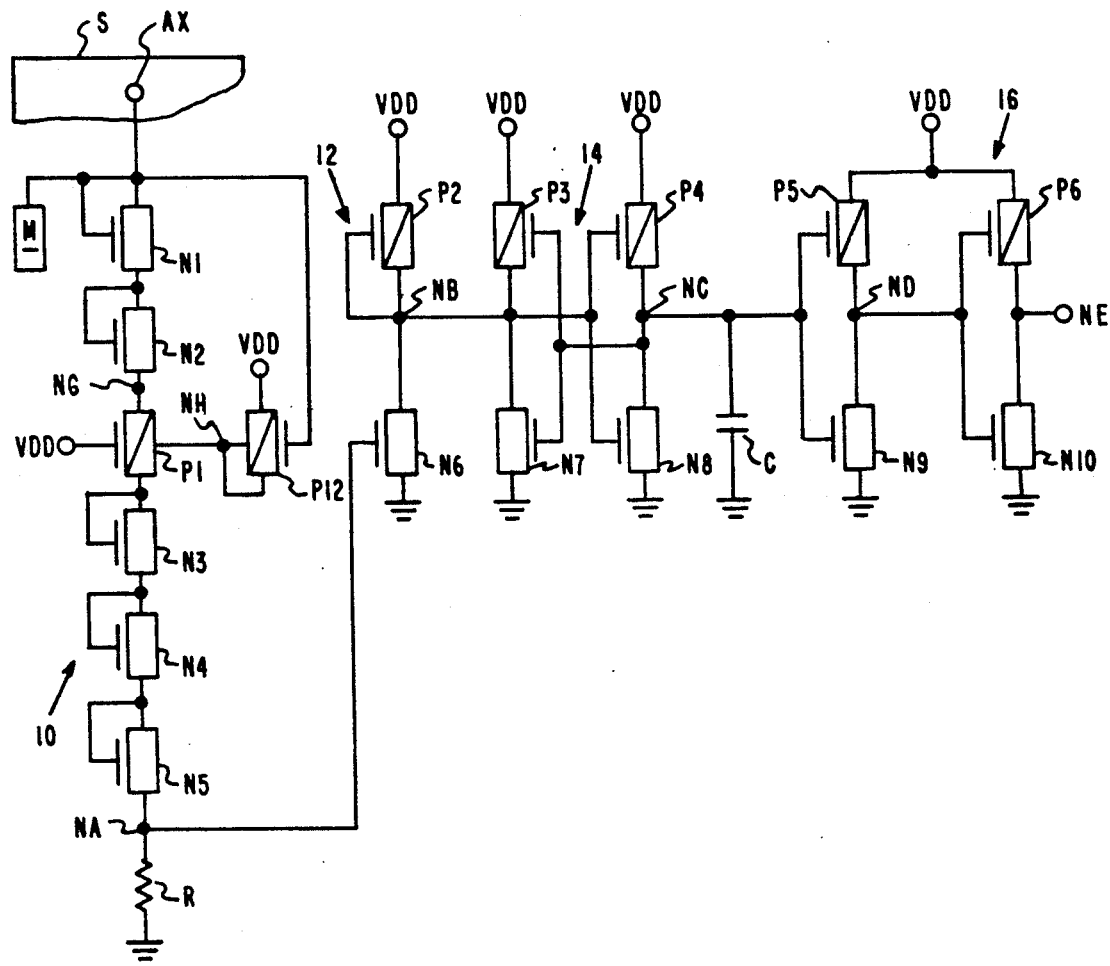
FIG. 1 is primarily a circuit diagram of a preferred embodiment of the test selection system of the present invention.

Referring to FIG. 1 of the drawings in more detail, there is shown a circuit diagram of a preferred embodiment of the test selection system of the invention which is made on a semiconductor substrate or integrated circuit chip S, only partly shown, in the CMOS technology. The CMOS circuits in the drawings have P-channel field effect transistors indicated by a rectangle with a diagonal line formed within the rectangle and a gate or control electrode arranged as a line adjacent and parallel to one side of the rectangle, and N-channel field effect transistors indicated simply by a rectangle without the diagonal line and a gate or control electrode arranged adjacent to one side of the rectangle.

The test selection system of FIG. 1 of the drawings includes a pin or pad AX connected or attached to the semiconductor substrate or chip S. A control voltage or enabling circuit 10 is connected between the pin or pad AX and a point of reference potential such as ground. The circuit 10 includes a series of diodes N1, N2, N3, N4 and N5, sometimes referred to as a diode tree, connected to a resistor R with a P-channel field effect transistor P1, arranged as an isolating device, interposed between the diodes N2 and N3 and a P-channel field effect transistor P12 connected to the N-wells of P1 and P12. The diodes N1, N2, N3, N4 and N5 are formed by N-channel field effect transistors having their gate or control electrodes connected to their drains. The P-channel transistor P1 has its gate or control electrode connected to a voltage supply source having a voltage terminal or voltage terminals VDD, preferably at 3.4 volts. The resistor R is connected between the series of diodes N1, N2, N3, N4 and N5 and ground, with a node NA being formed between the resistor R and diode N5. The P-channel transistor P12 has its gate or control electrode connected to pad AX and its source connected to supply verminal VDD. The drain of P12 is connected to its own N-well, NH, and also to that of P1.

An integrated circuit designated as M in FIG. 1 is also connected to the pin or pad AX, which is one of the normal address pins or pads of the integrated circuit M that is used, e.g., during normal writing and reading cycles in the operation of a memory. The integrated circuit M may be any known memory or logic circuit, but the test selection system of the present invention is particularly useful when employed with asynchronous static random access memory circuits since, due to the high flexibility of signals on all pins or pads of this type of memory, there are no unused input signal timings or periods that can be used for applying test control pulses as can generally be done with dynamic random access memory circuits.

A latch conditioning circuit 12 includes a P-channel field effect transistor P2 serially connected with an N-channel field effect transistor N6 between the voltage supply source terminal VDD and ground. The control electrode of the P-channel transistor P2 is connected to its drain to form a diode and the control electrode of the N-channel transistor N6 is connected to the node NA of the control voltage circuit 10, with the common point between the transistors P2 and N6 being an output node NB.

A latch 14, sometimes referred to as a keeper latch, includes a first CMOS inverter having a P-channel field effect transistor P3 and an N-channel field effect transistor N7 and a second CMOS inverter having a P-channel field effect transistor P4 and an N-channel field effect transistor N8. The common point between the transistors P3 and N7 of the first CMOS inverter and the control electrodes of the transistors P4 and N8 of the second CMOS inverter are connected to the node NB of the latch conditioning circuit 12, and the control electrodes of the transistors P3 and N7 of the first CMOS inverter are connected to the common point, node NC, between the transistors P4 and N8 of the second CMOS inverter. A capacitor C is also connected to node NC.

A buffer circuit 16 includes a third CMOS inverter having a P-channel field effect transistor P5 and an N-channel field effect transistor N9 and an output node ND, and a fourth CMOS inverter having a P-channel field effect transistor P6 and an N-channel field effect transistor N10 and an output node NE which may be used to provide an enable signal for test purposes. Control electrodes of the transistors P5 and N9 of the third CMOS inverter are connected to the output node or terminal NC of the latch 14 and control electrodes of the transistors P6 and N10 of the fourth CMOS inverter are connected to the output node ND of the third CMOS inverter.

Figure 2:
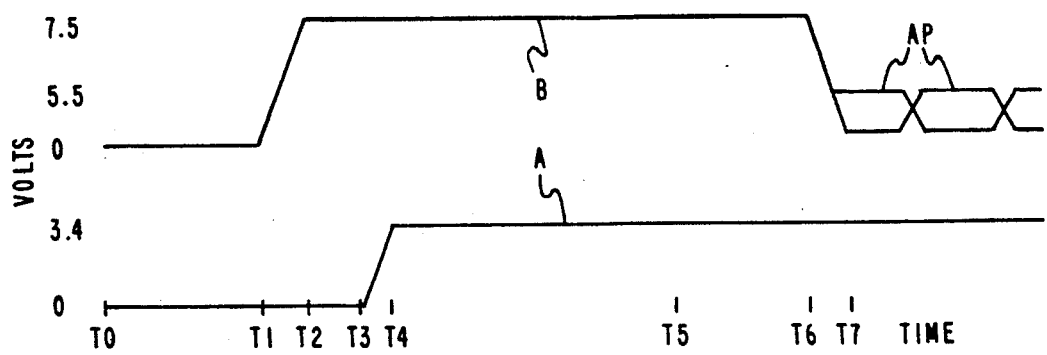
FIG. 2 is a graph of voltages applied to pins or terminals of the test selection system illustrated in FIG. 1.

To better understand the operation of the embodiment of the integrated circuit system or test selection system illustrated in FIG. 1, reference may be had to the graphs shown in FIG. 2 of the drawings which indicate the voltages applied to the pin or pad AX on the semiconductor substrate or integrated chip S and to the voltage supply source terminals VDD as a function of time. The test selection system is formed on the substrate or chip S along with the integrated circuit or memory M and uses the pin or pad AX and the voltage supply source terminals VDD as input or voltage terminals. Under normal operating conditions of the integrated circuit or memory M, the pin or pad AX is used as a normal address pin for the integrated circuit or memory M. As indicated in the graphs of FIG. 2, the circuits of FIG. 1 are designed for a nominal voltage of 3.4 volts on terminals VDD, as shown in curve A. Also, the circuits of FIG. 1 are designed at a most positive up level of 5.5 volts with an overshoot of 0.5 volts applied to the address pin or pad AX during normal operation, as indicated in FIG. 2 by address pulse curves AP.

Accordingly, it can be seen that with the voltage on pin AX at even the most positive up level during power-up for normal operation of the integrated circuit or memory M, the voltage dropping diodes N1, N2, N3, N4 and N5 prevent the voltage at node NA from rising significantly above ground level, since each diode has a voltage drop of about 1.1 to 1.2 volts.

To operate the circuit of FIG. 1 in a test mode, i.e., in a mode for implementing a special test or measurement function or algorithm designed to enhance the ability of a user to determine the integrity of a part, the voltages indicated by curves A and B of FIG. 2 are applied to the voltage supply source terminal VDD and the pin or pad AX, respectively. As can be seen from FIG. 2, at time T0 the voltage on terminals VDD and on pin AX is at 0 volts. At time T1 the voltage on pin AX, as represented by curve B, begins to increase until it reaches 7.5 volts at time T2. At time T3 the voltage on terminals VDD begins to increase until at time T4 it reaches 3.4 volts. During the time between about T2 and T3, which may be equal to or greater than 1 microsecond, a voltage of about 1.5 volts or higher is established at node NA of the control voltage or enabling circuit 10 which is above the threshold voltage of the N-channel transistors and, therefore, sufficiently high to turn on the N-channel transistor N6 of the latch conditioning circuit 12.

The purpose of P-channel transistor P12 in the control voltage or enabling circuit 10 is to allow the N-wells of P-channel transistor P1 to float during test mode but to be charged to VDD during normal operation. At the time T1, P12 is off allowing the N-well, NH, to float. As pad or terminal AX rises to 7.5 volts between times T1 and T2, NG rises forward biasing the PN diode consisting of the source of P1 and it's N-well. The N-well, NH, thus charges to NG - 0.7 volts and P-channel transistor P1 turns on allowing NA to rise as described above.

It can be seen that N-channel transistor N6 of the latch conditioning circuit 12 is turned on by the voltage from node NA of the control voltage or enabling circuit 10 at time T2 due to AX pad potential of 7.5 volts. As supply voltage VDD rises between T3 and T4 node NB is held near ground turning off the N-channel transistor N8 and turning on the P-channel transistor P4 of the latch 14 which causes the voltage at node NC to increase. The increase in voltage at node NC becomes sufficiently high to turn on N-channel transistor N7 and to turn off P-channel transistor P3 of the latch resulting in the latch flipping its output voltage to a high or logical 1 voltage. Thus, the voltage at the output of the buffer circuit 16, i.e., at node NE is also high or at a logical 1 voltage. The high voltage at node NE can now be used as an enabling signal to activate a test circuit formed on the substrate or chip S.

At time T4 in the graph of FIG. 2, the voltage at the terminals VDD as shown in curve A has reached the full voltage source value of 3.4 volts. Since this voltage is applied to the control electrode of the P-channel transistor P1 of the control voltage or enabling circuit 10, the P-channel transistor P1 will turn off when pad AX falls back into normal operating voltage range at time T7. This causes the voltage at node NA to again drop to 0 volts, turning off the N-channel transistor N6 of the latch conditioning circuit 12. However, by the time T4 the latch 14 has already been set. The turning off of the isolator transistor P1 serves to minimize or eliminate current leakage or power loss through the control voltage circuit 10 and to minimize any increase in capacitance that may be produced as a result of a circuit addition. After time T4, one or more microseconds of time are required to permit the voltage on terminals VDD to stabilize at the final value of 3.4 volts and the voltage at the output, or node NE, of the buffer circuit 16 to reach a full logic 1 value, enabling any circuitry which is to be used for special test purposes. The time required to stabilize the voltages depends on the slew rate of the voltage supply source and the speed of the circuit. At time T5 the test selection system is in the test mode and, thereafter, at time T6, the high voltage of 7.5 volts on the pin AX may be removed, as indicated by curve B in FIG. 2, and the address pulses AP applied thereto at about time T7, as also indicated in FIG. 2 of the drawings. Since the high voltage of 7.5 volts is applied to the circuits on the semiconductor substrate or chip S for only a matter of a few microseconds, the elements or transistors of the circuits will not experience deterioration or damage by the application of this voltage to pin AX.

The capacitor C is preferably connected to the output, or node NC, of the latch 14 as a latch load slowing down the response of the latch 14 in order to minimize or eliminate undesirable flipping or switching of the latch 14 by spurious signals or extraneous noise spikes or glitches.

After the testing of the desired circuits has been completed, recovery from the test mode is achieved by simply powering down the circuit, i.e., removing the voltage from the terminals VDD. The powering down operation frees the latch 14 and, upon powering up, with normal operating voltages on the pin AX, node NB becomes charged to again turn on the N-channel transistor N8 and turn off the P-channel transistor P4 of the latch 14 to reset the latch with its input, or node NB, high and its output, or node NC, low, and, thus, the voltage at the output node NE is also low.

Figure 3:
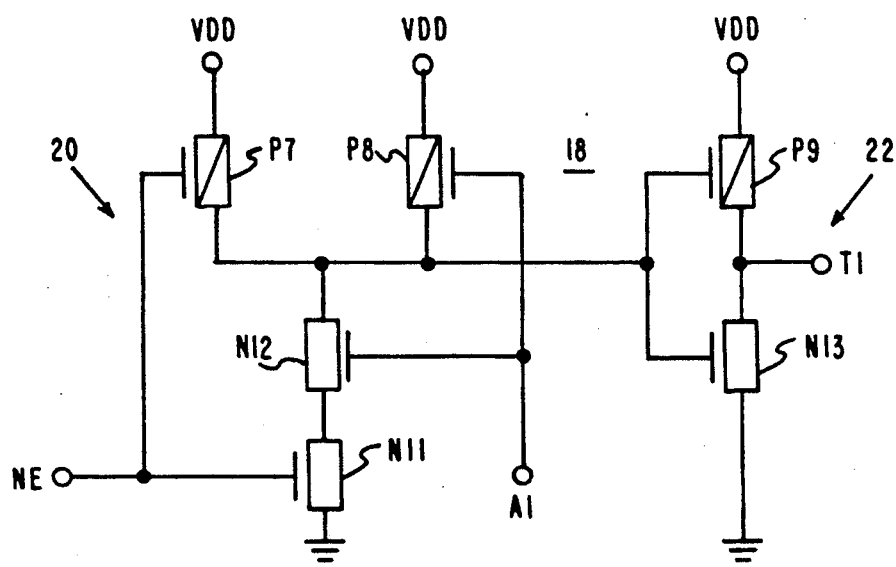
FIG. 3 is a circuit diagram of a logic circuit which can be incorporated into the test selection system illustrated in FIG. 1.

Although the voltage on node NE from the buffer circuit 16 can be used in a simple scheme for conducting circuit tests, if more complex testing is desired, logical combinations with a number of address input signals to allow programming of a large number of special on-chip or on board test enabling signals may be used. This more complex testing can be provided by the test selection system of the present invention by incorporating into the system of this invention a logic circuit, e.g. a CMOS AND circuit 18 as illustrated in FIG. 3 of the drawings. The AND circuit 18 include a NAND circuit 20 having an output connected to an input of an inverter 22 which has an output terminal T1 that may be connected to any circuits, not shown, to be tested on the substrate or chip S. The NAND circuit 20 includes P-channel field effect transistors P7 and P8 and N-channel field effect transistors N11 and N12, and the inverter 22 includes a P-channel field effect transistor P9 and an N-channel field effect transistor N13. As can be seen from FIG. 3, the inputs to the AND circuit 18 include the terminal NE from the output of the buffer circuit 16 of FIG. 1 connected to control electrodes of the P-channel transistor P7 and the N-channel transistor N11 and a terminal A1 for applying any desired address input signals to control electrodes of the P-channel transistor P8 and the N-channel transistor N12 of the NAND circuit 20 for test purposes. Although only one logic circuit, the AND circuit 18, has been illustrated in the drawings as being connected to the output node NE of the buffer circuit 16, it should be understood that more than one logic circuit can be AND'ed with node NE to provide additional tests.

It was stated hereinabove that recovery from the test mode may be made by powering down the circuits on the substrate or chip S. However, it may be desirable at times to recover from the test mode without powering down the circuits on the substrate S. To recover from the test mode without powering down, the test selection system may be modified by adding the circuit illustrated in FIG. 4 of the drawings to the circuit illustrated in FIG. 1. As can be seen from FIG. 4, the semiconductor substrate or integrated circuit chip S includes another pin or pad AY connected thereto from which is connected a test mode disabling or release circuit 10' having a diode tree somewhat similar to that of the control voltage or engaging circuit 10 shown in FIG. 1. The disabling circuit 10' includes serially arranged diodes N1', N2', N3', N4' and N5' and a P-channel field effect transistor P1' connected to a resistor R', with the resistor R' and the diode N5' forming an output node NA' at the common point therebetween. A CMOS inverter 24 includes a P-channel field effect transistor P10 and an N-channel field effect transistor N14 having an output node NF and an input connected to the output node NA'. A P-channel field effect transistor P11 is connected between a voltage source terminal VDD and the output node NB in parallel with the P-channel transistor P2 of the latch conditioning circuit 12 of the system of FIG. 1 of the drawings, with a control electrode of the P-channel transistor P11 being connected to the output node NF of the inverter 24. The pin or pad AY, like pin or pad AX, is also connected to the integrated circuit or memory M.

Figure 4:
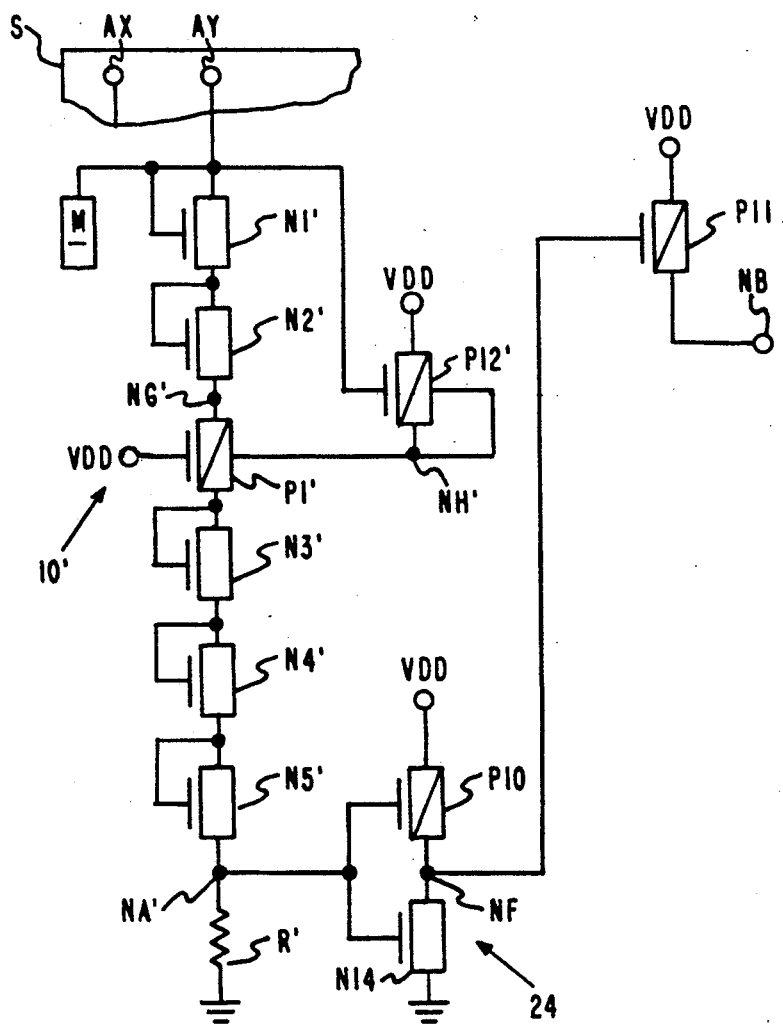
FIG. 4 is primarily a circuit diagram of a test release or test disabling circuit that can be used with the test selection system illustrated in FIG. 1 of the drawings.

In the operation of the disabling circuit of FIG. 4 in conjunction with the circuit of FIG. 1, after all desired testing of the integrated circuits on the substrate S has been completed the voltages as indicated in the graph of FIG. 2 of the drawings are applied with the voltage represented by curve B being applied to the pin or pad AY instead of to pin or pad AX and the voltage represented by curve A being applied to the voltage supply source terminals VDD. With the high voltage of 7.5 volts applied to the pin AY, a control voltage of 1.5 volts or more is developed at the node NA' which is sufficiently high to turn on the N-channel transistor N14 of the inverter 24, discharging node NF and turning on P-channel transistor P11. The P-channel transistor P11 then charges up output node NB of the latch conditioning circuit 12 to reset the latch 14 with its output at node NC being low, and, therefore, the output node NE of the buffer circuit 16 being low or at a logical 0 value. With the voltage represented by curve A of FIG. 2 being applied to the control electrode of the P-channel transistor P1' of the disabling circuit 10' a short time after the voltage on curve B reaches its maximum value of 7.5 volts, current flows through the resistor R' for only a very short period of time and, therefore, again there is very little current leakage or power loss in the circuit of this invention. Accordingly, it can be seen that with the latch 14 reset in this manner, normal operation of the integrated circuit or memory M can resume without powering down the circuits formed on the substrate or chip S.

It should be understood that depending upon the magnitude of the voltage of the voltage supply source and the interface levels used in any particular circuit design, the number of dropping diodes N1 to N5 of the control voltage or enabling circuit 10 of FIG. 1 and of the dropping diodes N1' to N5' of the disabling circuit 10' of FIG. 4 are adjusted to accommodate the particular conditions.

Furthermore, it should be understood that, if desired, the diodes N1 to N5 and N1' to N5' may be made with P-channel field effect transistors and the P-channel transistors P1 and P1' may be replaced with N-channel field effect transistors, along with appropriate voltage polarities and magnitudes applied thereto. The CMOS circuits illustrated in FIGS. 1, 3 and 4 of the drawings were designed in the N-well technology with all wells connected to the terminal VDD except for those wells associated with P-channel transistors P1, P1', P12, and P12' and with appropriate guard rings provided for the transistors forming the serial arrangements in the control or enabling circuit 10 and in the disabling or releasing circuit 10' to prevent latch-up in the CMOS circuits.

It can be seen that in accordance with the teachings of this invention, a test procedure and circuit have been described which allow for the selection of special test modes or functions at the module or package level without requiring additional test pins on the semiconductor substrate or chip, such as used for static random access memory, with industry standard pin-outs, and, thus, without increasing the size of the semiconductor circuit package. The scheme and circuit as taught by the present invention allow for the use of existing pins on, e.g., asynchronous static random access memories, to enter special test modes from a package level by using on the address pins voltages outside of the normal operating range of the memories, which voltages may be either higher or lower than the normal voltage operating range of the integrated circuit. The circuit of this invention does not produce an undesirable increase in input leakage or input capacitance, and there is no decrease in reliability resulting from an overvoltage on the address pins due to the application of this high voltage for only a very short period of time.

While the invention has been particularly shown and described with reference to preferred embodiments thereof, it will be understood by those skilled in the art that various changes in form and details may be made therein without departing from the spirit and scope of the invention.

What is claimed is:

1. An integrated circuit system comprising
a semiconductor substrate,
a pin connected to said semiconductor substrate,
integrated circuit means connected to said pin and disposed on said semiconductor substrate and operable at a first voltage,
test selection means having an output terminal connected to said pin for producing a control pulse at said output terminal for a given period of time and operable at a second voltage higher than said first voltage,
means for applying said second voltage to said pin during a first portion of said given period of time, and
means for applying said first voltage to said pin during a second portion of said given period of time without said first portion.

2. An integrated circuit system as set forth in claim 1 wherein said test selection means includes a latch.

3. An integrated circuit system as set forth in claim 2 wherein said test selection means comprises a series circuit including a series of diodes in series with a resistor connected between said pin and a point of reference potential.

4. An integrated circuit system as set forth in claim 3 wherein said series circuit includes isolating means for interrupting current flow through said series circuit.

5. An integrated circuit system as set forth in claim 4 wherein said isolating means includes a transistor responsive to said first voltage.

6. A test selection system comprising
a semiconductor substrate,
a pin connected to said semiconductor substrate,
integrated circuit means connected to said pin operable at a first voltage within a given voltage range,
control voltage circuit means connected to said pin having an output producing a first control voltage operable at a second voltage without said given voltage range,
means for applying said second voltage to said pin during a first period of time,
a latch having an input and an output,
a latch conditioning circuit means having an output connected to the input of said latch and an input responsive to the first control voltage from the output of said control voltage circuit means for producing a second control voltage at the output of said latch conditioning circuit means during said first period of time,
means for initially applying a supply source voltage to said latch after producing said second control voltage,
a test enable terminal,
a buffer circuit having an input connected to the output of said latch and an output connected to said test enable terminal, and
means for applying said first operating voltage to said pin during a second period of time without said first period of time.

7. A test selection system as set forth in claim 6 wherein said control voltage circuit means includes a plurality of serially arranged diodes.

8. A test selection system as set forth in claim 7 wherein said control voltage circuit means further includes a resistor connected between said plurality of serially arranged diodes and a point of reference potential.

9. A test selection system as set forth in claim 8 wherein said control voltage circuit means further includes an isolating device interposed between said pin and said point of reference potential.

10. A test selection system as set forth in claim 6 wherein said latch includes first and second inverters each having an input and an output with the output of said first inverter being connected to the input of said second inverter and the output of the second inverter being connected to the input of said first inverter.

11. A test selection system as set forth in claim 10 wherein each of said inverters includes a P-channel field effect transistor and an N-channel field effect transistor.

12. A test selection system as set forth in claim 6 further including a capacitor connected to the output of said latch.

13. A test selection system as set forth in claim 6 further including a logic circuit having first and second inputs and an output, the first input of said logic circuit being connected to said test enable terminal and the second input of said logic circuit being connected to a source of address input signals.

14. A test selection system as set forth in claim 13 wherein said logic circuit is an AND circuit.

15. A test selection system as set forth in claim 14 wherein said AND circuit comprises a NAND circuit including the first and second inputs of said logic circuit and an inverter, with said inverter being interposed between the output of said NAND circuit and the output of said logic circuit.

16. A test selection system as set forth in claim 6 further including
a second pin connected to said semiconductor substrate, and
a disabling circuit connected to said second pin and having an output coupled to said latch conditioning circuit.

17. A test selection system as set forth in claim 16 wherein said disabling circuit includes a plurality of serially arranged diodes and a resistor connected between said second pin and a point of reference potential.

18. An integrated circuit system comprising
a semiconductor substrate,
first and second pins connected to said semiconductor substrate,
integrated circuit means connected to said first and second pins and disposed on said semiconductor substrate operable at a first operating voltage during first and second periods of time,
first control voltage circuit means connected to said first pin for producing a first control voltage and operable at a second operating voltage having a magnitude larger than that of said first operating voltage,
latching means responsive to said first control voltage for establishing said latching means in a first state during said first period of time, and
second control voltage circuit means operable at said second operating voltage and connected to said second pin producing a second control voltage for establishing said latching means in a second state during said second period of time subsequent to said first period of time.

19. An integrated circuit system as set forth in claim 18 wherein each of said first and second control voltage circuit means includes a series circuit having a plurality of diodes and a resistor connected between said first and second pins, respectively, and a point of reference potential.

20. A test selection system comprising
a semiconductor substrate,
a pin connected to said semiconductor substrate,
integrated circuit means connected to said pin operable at a first operating voltage within a given voltage range,
control voltage circuit means connected to said pin having an output producing a control voltage operable at a second voltage without said given voltage range, said control voltage circuit means including a plurality of serially arranged diodes, a resistor connected between said plurality of serially arranged diodes and a point of reference potential and an isolating device interposed between said pin and said point of reference potential,
means for activating said isolating device after said control voltage is produced,
means for applying said second voltage to said pin during a first period of time,
a latch having an input and an output,
a latch conditioning circuit having an output connected to the input of said latch and an input responsive to the control voltage from the output of said control voltage circuit means,
a test enable terminal,
a buffer circuit having an input connected to the output of said latch and an output connected to said test enable terminal, and
means for applying said first operating voltage to said pin during a second period of time.

21. A test selection system comprising
a semiconductor substrate,
a pin connected to said semiconductor substrate,
integrated circuit means connected to said pin operable at a first operating voltage within a given voltage range,
control voltage circuit means connected to said pin having an output producing a control voltage operable at a second voltage without said given voltage range,
means for applying said second voltage to said pin during a first period of time,
a latch having an input and an output,
a latch conditioning circuit having an output connected to the input of said latch and an input responsive to the control voltage from the output of said control voltage circuit means, said latch conditioning circuit including first and second serially connected transistors having its output at the common point between said transistors and its input at a control electrode of one of said first and second transistors,
a test enable terminal,
a buffer circuit having an input connected to the output of said latch and an output connected to said test enable terminal, and
means for applying said first operating voltage to said pin during a second period of time.

22. A test selection system comprising
a semiconductor substrate,
a pin connected to said semiconductor substrate,
integrated circuit means connected to said pin operable at a first operating voltage within a given voltage range,
control voltage circuit means connected to said pin having an output producing a control voltage operable at a second voltage without said given voltage range,
means for applying said second voltage to said pin during a first period of time,
a latch having an input and an output,
a latch conditioning circuit having an output connected to the input of said latch and an input responsive to the control voltage from the output of said control voltage circuit means,
a test enable terminal,
a buffer circuit having an input connected to the output of said latch and an output connected to said test enable terminal, said buffer circuit including first and second inverters each having an input and an output, with the input of said first inverter being connected to the output of said latch and the output of said first inverter being connected to the input of said second inverter, and an output of said second inverter being connected to said test enable terminal, and
means for applying said first operating voltage to said pin during a second period of time.

23. A test selection system as set forth in claim 20 wherein said isolating means includes a transistor and said activating means includes means for applying said first voltage to a control electrode of said transistor.

24. A test selection system as set forth in claim 23 wherein said transistor is a P-channel field effect transistor and wherein each diode of said plurality of serially arranged diodes is an N-channel field effect transistor arranged as a diode.

25. A test selection system as set forth in claim 21 wherein said first transistor is a P-channel field effect transistor connected between the output of said latch conditioning circuit and a first point of reference potential and having a control electrode connected to the output of said latch conditioning circuit, and said second transistor is an N-channel field effect transistor connected between a second point of reference potential and the output of the latch conditioning circuit and having a control electrode connected to the output of said control voltage circuit means.

* * * * *